United States Patent
Chuo et al.

(10) Patent No.: US 7,907,739 B2
(45) Date of Patent: Mar. 15, 2011

(54) METHOD OF VOLUME CONTROLLING

(75) Inventors: Yu-Hsin Chuo, Taipei (TW); Chien-Ming Huang, Taipei (TW)

(73) Assignee: Micro-Star Int'l Co., Ltd., Zhonghe Dist, New Taipei (TW)

( * ) Notice: Subject to any disclaimer, the term of this patent is extended or adjusted under 35 U.S.C. 154(b) by 1198 days.

(21) Appl. No.: 11/538,062

(22) Filed: Oct. 3, 2006

(65) Prior Publication Data

US 2008/0013754 A1    Jan. 17, 2008

(30) Foreign Application Priority Data

Jul. 12, 2006   (TW) ............................... 95125474 A

(51) Int. Cl.
  *H03G 3/00* (2006.01)
(52) U.S. Cl. ......... 381/109; 381/104; 381/105; 381/107
(58) Field of Classification Search .......... 381/104–109, 381/72

See application file for complete search history.

(56) References Cited

U.S. PATENT DOCUMENTS

| | | | |
|---|---|---|---|
| 6,535,611 | B1 | 3/2003 | Lau |
| 2006/0072769 | A1* | 4/2006 | Taniguchi ..................... 381/104 |
| 2007/0025189 | A1* | 2/2007 | Wang et al. .................... 368/243 |

FOREIGN PATENT DOCUMENTS

| | | |
|---|---|---|
| DE | 23 32 140 A1 | 1/1975 |
| DE | 40 17 506 A1 | 12/1991 |
| JP | S5936686 | 3/1984 |
| JP | S6150326 | 4/1986 |
| JP | S62292008 | 12/1987 |
| JP | H2222310 | 9/1990 |
| JP | H4139658 | 5/1992 |
| JP | H04352509 | 12/1992 |
| JP | H07202600 | 8/1995 |
| JP | H8195634 | 7/1996 |
| JP | H10163775 | 6/1998 |
| JP | 2001274634 | 10/2001 |
| JP | 2003152483 | 5/2003 |
| JP | 200480496 | 3/2004 |
| JP | 2004166033 | 6/2004 |
| JP | 200579877 | 3/2005 |
| JP | 2005286546 | 10/2005 |
| TW | 591965 | 6/2004 |
| TW | 1254275 | 5/2006 |
| TW | 1254589 | 5/2006 |

* cited by examiner

Primary Examiner — Devona E Faulk
Assistant Examiner — Disler Paul
(74) Attorney, Agent, or Firm — Winston Hsu; Scott Margo

(57) ABSTRACT

Disclosed is a method of volume controlling, including: (a) receiving a volume adjusting command; (b) determining if the volume corresponding to the volume adjusting command is in a predetermined volume range; (c) if the volume corresponding to the volume adjusting command is in the predetermined volume range, utilizing the volume adjusting command to adjust a current volume; (d) if the volume corresponding to the volume adjusting command does not fall in the predetermined volume range, then (d1) utilizing the volume adjusting command to adjust the current volume; and (d2) computing the using time for the current volume, and adjusting the current volume referring to the predetermined volume range when the using time reaches a predetermined value.

13 Claims, 4 Drawing Sheets

METHOD OF VOLUME CONTROLLING

BACKGROUND OF THE INVENTION

1. Field of the Invention

The present invention relates to a method of volume controlling, and particularly relates to a method of volume computing using time to adjust a current volume according to a predetermined volume.

2. Description of the Prior Art

Portable electronic devices have become increasingly popular as technology becomes more sophisticated. Specifically, MP3 (Mpeg Layer 3) players have had considerable success in the market. Users enjoying music from their MP3 players can be seen everywhere.

Since the user of an MP3 player usually listens to music via an earphone for a long time, there is a potential problem of hearing damage if the sound level is too high. Controlling the volume level of an MP3 player is therefore very important. Current MP3 players do not have such controlling mechanisms, however.

Similarly, a handheld device may have a minimum volume level to enable users to hear sound, for example Internet broadcasts or videoconference streaming. In such a case, a minimum volume level needs to be set.

Therefore, a new invention is needed to solve these problems.

SUMMARY OF THE INVENTION

One objective of the present invention is to provide a volume controlling method, which determines if a requested volume lies in a particular range and computes a time of using the requested volume to bring the requested volume to within a predetermined range.

Another objective of the present invention is to provide a volume controlling method, which determines if a requested volume is larger than a predetermined volume, and computes a time of using the requested volume to adjust the requested volume by increments to be less than a predetermined volume.

The present invention discloses a method of volume controlling, which comprises: (a) receiving a volume adjusting command; (b) determining if the volume corresponding to the volume adjusting command is in a predetermined volume range; (c) if the volume corresponding to the volume adjusting command is in the predetermined volume range, utilizing the volume adjusting command to adjust a current volume; (d) if the volume corresponding to the volume adjusting command does not fall in the predetermined volume range, then (d1) utilizing the volume adjusting command to adjust the current volume; and (d2) counting a using time for the current volume, and adjusting the current volume by increments with reference to the predetermined volume range when the using time reaches a predetermined value.

The predetermined volume range can be from a predetermined volume larger than the current volume to infinity, and the step (d2) increases the current volume. Alternatively, the predetermined volume range can be from 0 to a predetermined volume less than the current volume, and the step (d2) decreases the current volume.

The disclosed invention also discloses a method of volume controlling, which comprises: receiving an instruction for adjusting a current volume to a first volume; determining if the first volume is less than a predetermined volume, if yes, adjusting the current volume to the first volume, if no, adjusting the current volume to the first volume and counting the time for using the first volume; then adjusting the current volume to a second volume less than the first volume if the time for using the first volume is larger than a first predetermined value.

If the second volume is still larger than the predetermined volume, the above mentioned method can further count a time for using the second volume, then adjust the current volume to a third volume less than the second volume if the time for using the second volume is larger than a second predetermined value.

The disclosed invention also discloses a method of volume controlling, which comprises: receiving an instruction for adjusting a current volume to a first volume; determining if the first volume is larger than a predetermined volume, if yes, adjusting the current volume to the first volume, if no, adjusting the current volume to the first volume and counting the time for using the first volume; and adjusting the current volume to a second volume larger than the first volume if the time for using the first volume is larger than a predetermined value.

If the second volume is less than the predetermined volume, the above mentioned method can further compute a time for using the second volume, then the current volume is adjusted to a third volume larger than the second volume if the time for using the second volume is larger than a predetermined value.

According to the above-mentioned method, a user's hearing can be prevented from damage due to unsuitable volume levels. Furthermore, the above-mentioned method can be applied to other audio displaying apparatus to control the volume to lie in a suitable range.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
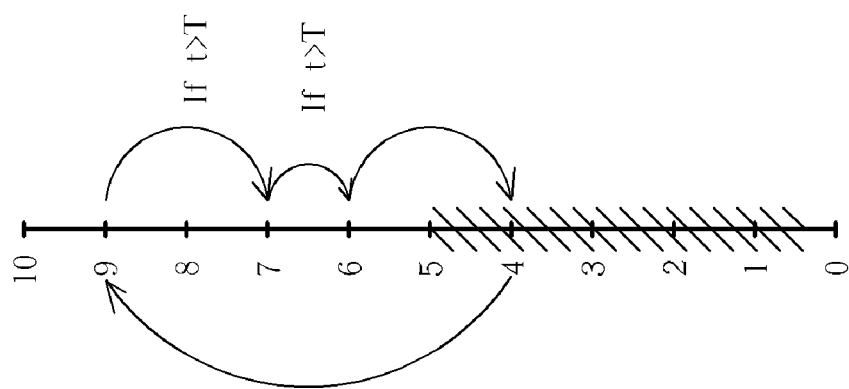
FIG. 1 is a schematic diagram illustrating a first preferred embodiment according to the present invention.

FIG. 1 is a schematic diagram illustrating a first preferred embodiment according to the present invention. As shown in FIG. 1, this embodiment classifies the volume to 10 degrees, where degree 0 is soundless. In the following example, the current volume is assumed to be degree 4, and the safe volume is set to degree 5. Then, an instruction for adjusting the current volume to a first volume is received (for example, degree 9) and the volume controlling method according to the present invention will determine if the first volume is less than or equal to the safe volume. If yes, the current volume is adjusted to the first volume and the volume controlling method ends. If the first volume is larger than 5 (as in this example), the current volume is adjusted to the first volume and a counter is started to monitor a time t for using the first volume. If the time t reaches a predetermined value $T_1$, the current volume is adjusted to a second volume smaller than the first volume (for example, degree 7 in this embodiment) and it is determined if the second volume is less than or equal to the safe volume. If yes, the volume controlling method ends, if no, a time t for using the second volume is counted. If the time t is larger than a predetermined value $T_2$, the current volume is adjusted to a third volume less than the second volume (for example, degree 4 in this embodiment) and it is determined if the third volume is less than or equal to the safe volume. If no, similar steps are repeated to lower the volume, if yes, the volume controlling method ends.

Figure 2:
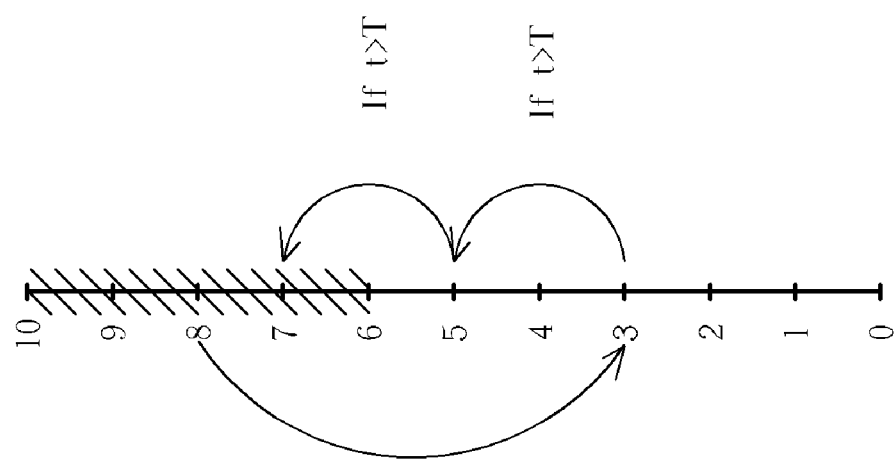
FIG. 2 is a schematic diagram illustrating a second preferred embodiment according to the present invention.

FIG. 2 is a schematic diagram illustrating a second preferred embodiment according to the present invention. The difference between the first embodiment shown in FIG. 1 and this second preferred embodiment is that the first embodiment adjusts the volume to be less than a specific volume, and the second embodiment adjusts the volume to be larger than a specific volume.

This embodiment also classifies the volume to 10 degrees, where degree 0 is soundless. The current volume is assumed to be degree 7, and the minimum volume for hearing is degree 6. Then, an instruction for adjusting the current volume to a first volume is received (for example, degree 3) and the volume controlling method according to the present invention will determine if the first volume is larger than or equal to the minimum volume. If yes, the current volume is adjusted to a first volume and the volume controlling method ends. If the first volume is less than degree 6 (as in this example), the current volume is adjusted to the first volume and a counter is started to monitor a time t for using the first volume. If the time t is larger than a predetermined value $T_1$, the current volume is adjusted to a second volume larger than the first volume (for example, degree 5 in this embodiment) and it is determined if the second volume is larger than or equal to the minimum volume. If yes, the volume controlling method ends, if no, a time t for using the second volume is counted. If the time t is larger than a predetermined value $T_2$, the current volume is then adjusted to a third volume larger than the second volume (for example, degree 7 in this embodiment) and it is determined if the third volume is larger than or equal to the minimum volume. If no, similar steps are repeated to increase the volume, if yes, the volume controlling method ends.

Besides an MP3 player, the above-mentioned volume controlling method can further be used in other portable electronic apparatus or any other audio displaying apparatus.

Also, the above-mentioned parameters such as volume adjusting amount, time t for using a new volume, the predetermined times T1, T2, and safe or minimum volume are not limited, and users can set their own limits according to their personal requirements.

Figure 3:
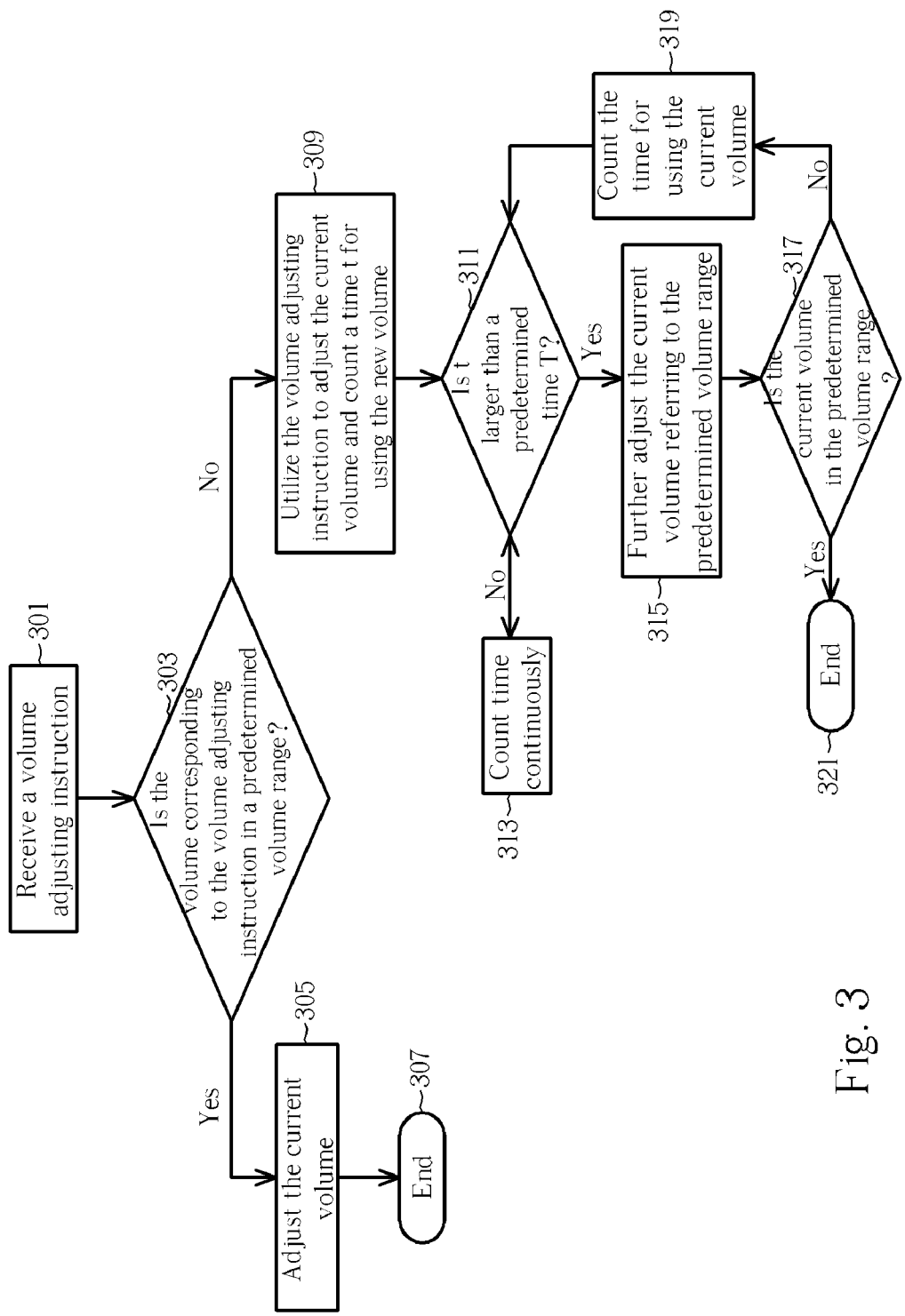
FIG. 3 is a flow chart corresponding to the first and second preferred embodiments of the present invention.

FIG. 3 is a flow chart corresponding to the first and second preferred embodiment of the present invention. Please refer to FIG. 1 and FIG. 3 together to understand the present invention more clearly. The steps are as follows:

Step 301: Receive a volume adjusting instruction.

Step 303: Determine if the volume corresponding to the volume adjusting instruction is in a predetermined volume range. If yes, enter step 305, if no, enter step 309.

Step 305: Adjust the current volume.

Step 307: End the controlling method.

Step 309: Utilize the volume adjusting instruction to adjust the current volume and count a time t for using the new volume.

Step 311: Determine if t is larger than a predetermined time T. If no, enter step 313, if yes, enter step 315.

Step 313: Count time continuously, and keep performing step 311 to determine if the time t is larger than a predetermined T.

Step 315: Further adjust the current volume referring to the predetermined volume range.

Step 317: Determine if the current volume is in the predetermined volume range. If no, enter step 319, if yes, enter step 321.

Step 319: Count the time for using the current volume. GO back to step 311

Step 321: End the volume controlling method.

In the embodiments shown in FIG. 1 and FIG. 2, step 315 approaches the predetermined volume range gradually, but this is not meant to limit the scope of the present invention. Step 315 can directly adjust the current volume to be in the predetermined volume range, thereby the following steps 317, 319, 321 can be omitted, and this modification also falls in the scope of the present invention. Also, step 303 can further generate a warning message to warn the user if step 303 determines the current volume is not in the predetermined volume range.

Furthermore, if the method corresponds to the preferred embodiment shown in FIG. 1, the predetermined volume range is from 0 to a predetermined (safe) volume (degree 5 in FIG. 1), and step 315 lowers the current volume. If the method corresponds to the preferred embodiment shown in FIG. 2, the predetermined (minimum) volume range is from a first predetermined volume (degree 6 in FIG. 2) to infinity (or a second predetermined volume larger than a first predetermined volume), and the step 315 increases the current volume.

Figure 4:
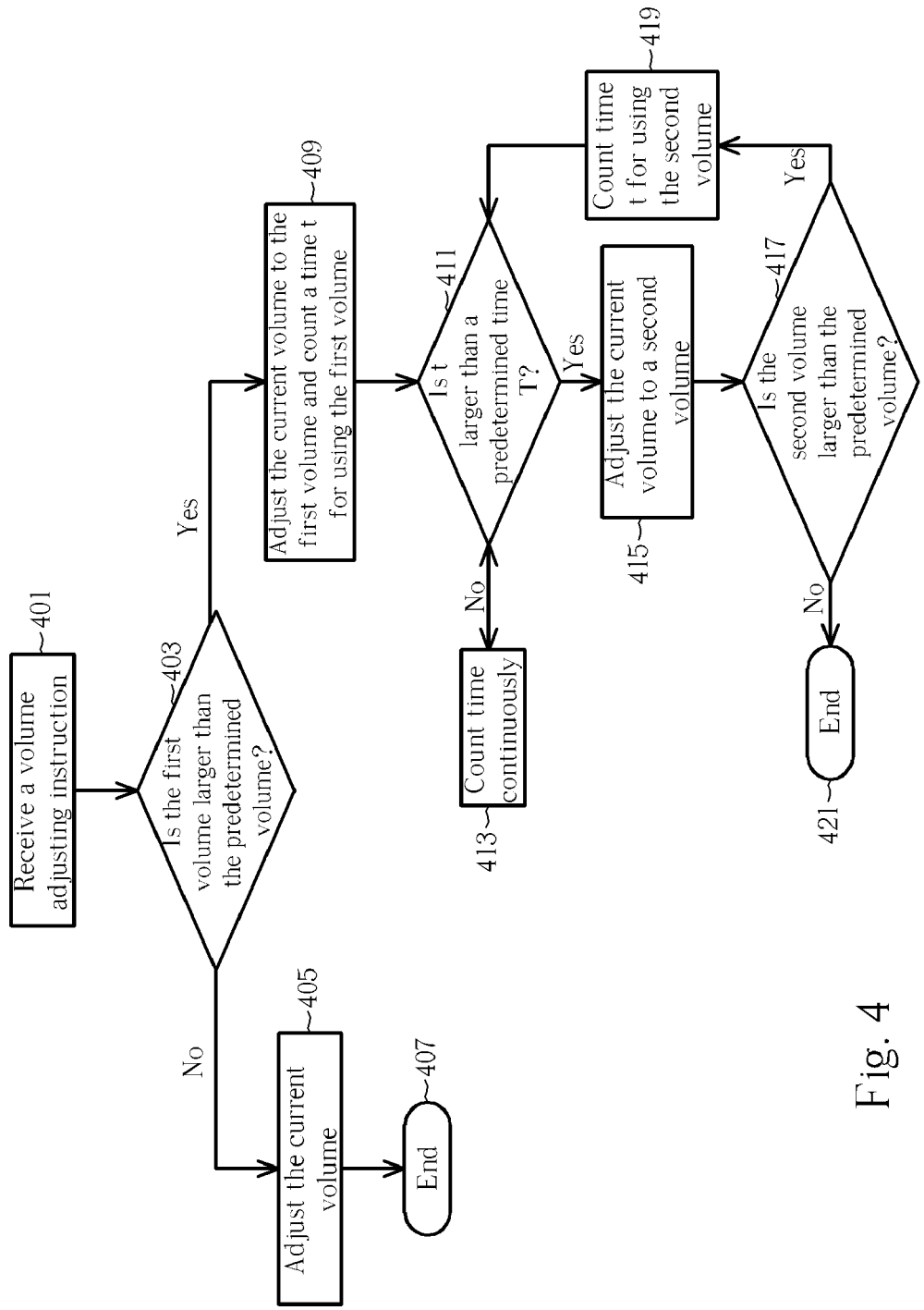
FIG. 4 is a flow chart corresponding to the first preferred embodiment of the present invention.

FIG. 4 is a flow chart corresponding to the first preferred embodiment of the present invention. The difference between this embodiment and the embodiment shown in FIG. 3 is that the embodiment shown in FIG. 3 determines if the new volume lies in a predetermined volume range, but the embodiment shown in FIG. 4 determines whether the new volume is greater or smaller than a predetermined volume. The flow chart in FIG. 4 comprises the following steps:

Step 401: Receive a volume adjusting instruction for adjusting the current volume to a first volume.

Step 403: Determine if the first volume is larger than the predetermined volume. If no, enter step 405, if yes, enter step 409.

Step 405: Adjust the current volume to the first volume.

Step 407: End this volume controlling method.

Step 409: Adjust the current volume to the first volume and count a time t for using the new volume.

Step 411: Determine if t is larger than a predetermined time t. If no, enter step 413, if yes, enter step 415.

Step 413: Count time continuously, and keep performing step 411 to determine if the time t is larger than a predetermined T.

Step 415: Adjust the current volume to a second volume less than the first volume.

Step 417: Determine if the second volume is larger than the predetermined volume. If no, enter step 421, if yes, enter step 419.

Step 419: Count time t for using the second volume. Go back to step 411.

Step 421: End this volume controlling method.

As in FIG. 3, step 415 can directly adjust the current volume to be less than a predetermined volume, thereby the following steps 417, 419, and 421 can be omitted, which also falls in the scope of the present invention. Also, step 403 can further generate a warning message to warn the user if step 403 determines the current volume is not larger than the predetermined volume range.

Furthermore, if the embodiment shown in FIG. 1 is changed to correspond to the second preferred embodiment shown in FIG. 2, some steps should be amended as detailed below:

Step 403: Determine if the first volume is less than the predetermined volume. If no, enter step 405, if yes, enter step 409.

Step 409: Adjust the current volume to a first volume larger than a current volume and compute the using time t of the new volume.

Step 415: Adjust the current volume to a second volume larger than a first volume.

Step 417: Determine if the second volume is less than the predetermined volume. If no, enter step 421, if yes, enter step 419.

According to the above-mentioned method, the hearing of a user can be prevented from damage due to unsuitable volume levels. Furthermore, the above-mentioned method can be applied to other audio displaying apparatus to control the volume to lie in a suitable range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of volume controlling, comprising:
    (a) receiving a volume adjusting command;
    (b) determining if the volume corresponding to the volume adjusting command is in a predetermined volume range;
    (c) if the volume corresponding to the volume adjusting command is in the predetermined volume range, utilizing the volume adjusting command to adjust a current volume;
    (d) if the volume corresponding to the volume adjusting command does not fall in the predetermined volume range, then
        (d1) utilizing the volume adjusting command to adjust the current volume; and
        (d2) counting a using time of the current volume, and adjusting the current volume by referring to the predetermined volume range when the using time reaches a predetermined value;
    wherein the predetermined volume range is from 0 to a predetermined volume less than the current volume, where the step (d2) further decreases the current volume.

2. The method of claim 1, wherein the step (d2) adjusts the current volume to approach the predetermined volume range if the time for using the current volume reaches the predetermined value.

3. The method of claim 2, wherein the step (d2) is repeated until the current volume is in the predetermined volume range.

4. The method of claim 1, wherein the step (d2) adjusts the current volume to fall in the predetermined volume range if the time for using the current volume reaches the predetermined value.

5. The method of claim 4, being used in a portable electronic device.

6. The method of claim 5, wherein the portable electronic device is an MP3 player.

7. The method of claim 1, wherein the step (d) further comprises: generating a warning message if the current volume is determined to be outside of the predetermined volume range.

8. The method of claim 1, wherein the predetermined volume range is from a predetermined volume larger than the current volume to infinity, where the step (d2) further increases the current volume.

9. A method of volume controlling, comprising:
    receiving an instruction for adjusting a current volume to a first volume;
    determining if the first volume is less than a predetermined volume, if yes, adjusting the current volume to the first volume, if no, adjusting the current volume to the first volume and counting a time of using the first volume; and
    adjusting the current volume to a second volume less than the first volume if the time of using the first volume is larger than a predetermined value.

10. The method of claim 9, further comprising counting a time of using the second volume if the second volume is larger than the predetermined volume, where the current volume is then adjusted to a third volume less than the second volume if the time for using the second volume is larger than a predetermined value.

11. The method of claim 9, being used in a portable electronic device.

12. The method of claim 11, wherein the portable electronic device is a MP3 player.

13. The method of claim 9, further comprising generating a warning voice if the first volume is larger than the predetermined volume.

* * * * *